United States Patent [19]

Tragen

[11] Patent Number: 4,674,007
[45] Date of Patent: Jun. 16, 1987

[54] METHOD AND APPARATUS FOR FACILITATING PRODUCTION OF ELECTRONIC CIRCUIT BOARDS

[75] Inventor: Barry J. Tragen, Forest Grove, Oreg.

[73] Assignee: Microscience Corporation, Dunwoody, Ga.

[21] Appl. No.: 760,264

[22] Filed: Jul. 29, 1985

Related U.S. Application Data

[63] Continuation-in-part of Ser. No. 742,448, Jun. 7, 1985, abandoned.

[51] Int. Cl.4 .............................................. H01R 9/00
[52] U.S. Cl. ..................... 361/404; 29/831; 29/832; 29/834; 29/837; 307/219; 307/441; 361/400; 361/408
[58] Field of Search ........................ 361/392, 397–398, 361/400–401, 405–406, 408–409, 413; 357/75, 80; 307/219, 441; 339/17 CF; 29/831–832, 834, 836–837

[56] References Cited

U.S. PATENT DOCUMENTS

| | | | |
|---|---|---|---|
| 3,436,604 | 4/1969 | Hyltin et al. | 357/75 X |
| 3,459,999 | 8/1969 | Kelly et al. | 339/17 CF |
| 3,605,063 | 9/1971 | Steward | 361/409 X |
| 3,746,973 | 7/1973 | McMahon, Jr. | 357/75 X |
| 3,860,831 | 1/1975 | Goser | 307/441 X |
| 3,917,984 | 11/1975 | Kong et al. | 339/17 CF X |
| 4,011,575 | 3/1977 | Groves | 361/400 X |
| 4,038,488 | 7/1977 | Lin | 357/75 X |
| 4,288,840 | 9/1981 | Konishikawa et al. | 174/68.5 X |
| 4,467,400 | 8/1984 | Stopper | 361/406 X |

FOREIGN PATENT DOCUMENTS

| | | | |
|---|---|---|---|
| 0070533 | 1/1983 | European Pat. Off. | 357/75 |
| 3209699 | 9/1983 | Fed. Rep. of Germany | 361/409 |
| 57-71166 | 5/1982 | Japan | 357/75 |
| 57-207356 | 12/1982 | Japan | 357/75 |
| 59-54252 | 3/1984 | Japan | 357/75 |
| 59-144155 | 8/1984 | Japan | 357/75 |

OTHER PUBLICATIONS

Bond, G. L., "Dual-Redundant Logic System", IBM Technical Discl., vol. 15, No. 4, Sep. 1972, pp. 1145–1146.

Primary Examiner—A. T. Grimley
Assistant Examiner—Jane K. Lau
Attorney, Agent, or Firm—Jim Zegeer

[57] ABSTRACT

In order to be able to adapt an electronic circuit board apparatus designed for a particular IC chip configuration to accept other chips to perform the same function, the socket for the IC chip is provided with a set of jumper terminals coupled to selected ones of the socket so that in the event the IC chip for which the IC chip was designed is not available, the circuit board can use other IC chips by connecting the jumpers to in effect redefine the socket. In addition, redundant parallel circuitry and IC chip sockets can be provided on the circuit board with each IC socket being wired to accept a variety of functionally identical IC chips.

3 Claims, 5 Drawing Figures

METHOD AND APPARATUS FOR FACILITATING PRODUCTION OF ELECTRONIC CIRCUIT BOARDS

REFERENCE TO RELATED APPLICATIONS

This application is a continuation-in-part of my application Serial No. 742,448, filed June 7, 1985 for "Method and Apparatus for Facilitating Production of Electronic Circuit Boards" now abandonded.

BACKGROUND AND BRIEF DESCRIPTION OF THE INVENTION

The invention relates to a method and apparatus for adapting a printed circuit board which was designed for a particular integrated circuit (IC) chip to perform certain specified functions, such as, 2K or 4K memory chip of one manufacture to use a different integrated circuit chip, such as an 8K memory chip of another manufacturer.

In the production of electronic components it frequently happens that a circuit is designed using a particular IC chip to perform a specified function, such as memory storage and after the printed circuit boards have been designed, debugged and/or fabricated, with printed circuits and socket connections for a designated IC chip, the particular IC chip for which the board was designed and the printed circuitry designed is not readily available or is delayed in delivery, whereas an IC chip of another manufacturer or design could perform essentially the same function but has its circuit pins utilized in a slightly different way. When such IC chip is inserted into the socket an printed circuit on the board, it obviously would not perform properly.

The object of the present invention is to provide a method and apparatus which permits the manufacturer (or maintenance personnel) to use the printed circuit board by modifying the socket connection using parallel jumpering for selected IC socket terminals.

BRIEF DESCRIPTION OF THE DRAWINGS

The above and other objects, advantages and feature of the invention will become more apparent when considered with the following specification and accompanying drawings wherein.

DETAILED DESCRIPTION

Figure 1:
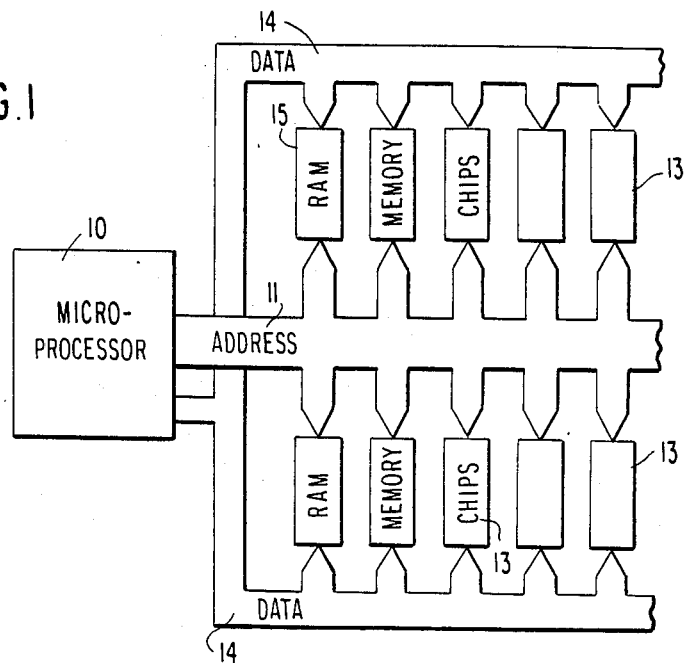
FIG. 1 is a partial schematic block diagram of a microprocessor and a bank of memory units connected to the microprocessor.

The partial block diagram of FIG. 1 is of an exemplary microprocessor 10 (which can be a Motorolla 68000 series, for example) connected by address bus 11 to the address inputs of a bank of IC memory chips 13, which are arrayed in pairs, and by data bus 14 to the data inputs of the IC memory chips. One or more utilization devices 15 can be connected to the microprocessor address and data busses.

Figure 2:
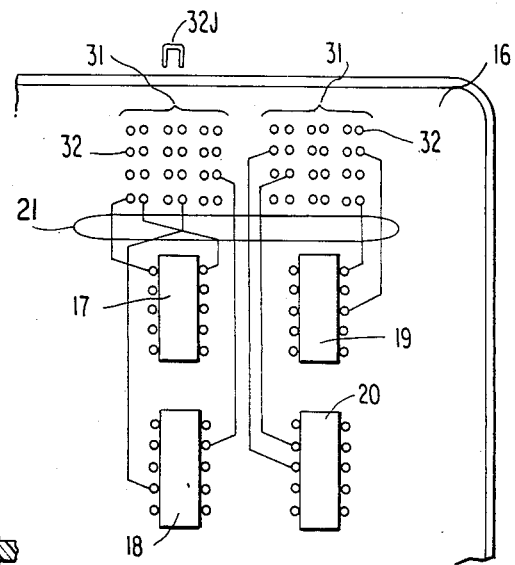
FIG. 2 shows a printed circuit board incorporating the unit.
Figure 5:
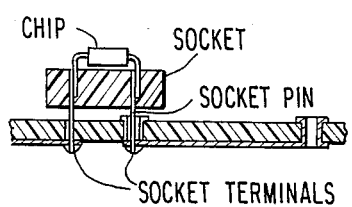
FIG. 5 is a perspective view of a socket and its terminals.

FIG. 2 illustrates a printed circuit board 16 having socket pairs 17, 18, 19, and 20, printed circuit wiring 21 for the address and data busses 11 and 14, respectively. Jumper terminal clusters 30 and 31 have individual jumper terminals 32 connected by printed circuit wiring 33 to selected ones of the sockets 17, 18, 19, and 20, shown in detail in FIG. 3. It will be appreciated that circuit board 16 can be multilayered with insulating films (not shown) permitting cross-overs in the printed conductor pattern.

Once the circuit design is established for the printed circuit boards, or if component replacement is required, for the memory components 13, for example, an identical component must be used since the sockets are wired by the printed circuitry for a specified component. Delay in fabrication or maintenance results if the component or equivalent thereof is not readily available.

The sockets 17, 18, 19 and 20 are initially selected to accept IC components with the largest number of pins, 28, for example.

According to the invention, the cluster of jumper terminals 30 and 31 are used to physically reconfigure the printed circuit connections to the pairs of the sockets. In this way, a component of different manufacture or memory capacity can be substituted for the one the circuit board was originally designed to have plugged into the sockets 17, 18, 19 and 20. In the circuit diagram of FIG. 3 for sockets 17 and 18, jumper terminal cluster 30 comprises three (3) separate banks 30A, 30B and 30C of eight (8) terminals each T1-T8 aligned four (4) abreast, with the spacing D between jumper terminals or posts T1-T2, T3, etc. being short and bridgeable by a U-shaped jumper wire 32J.

Figure 3:
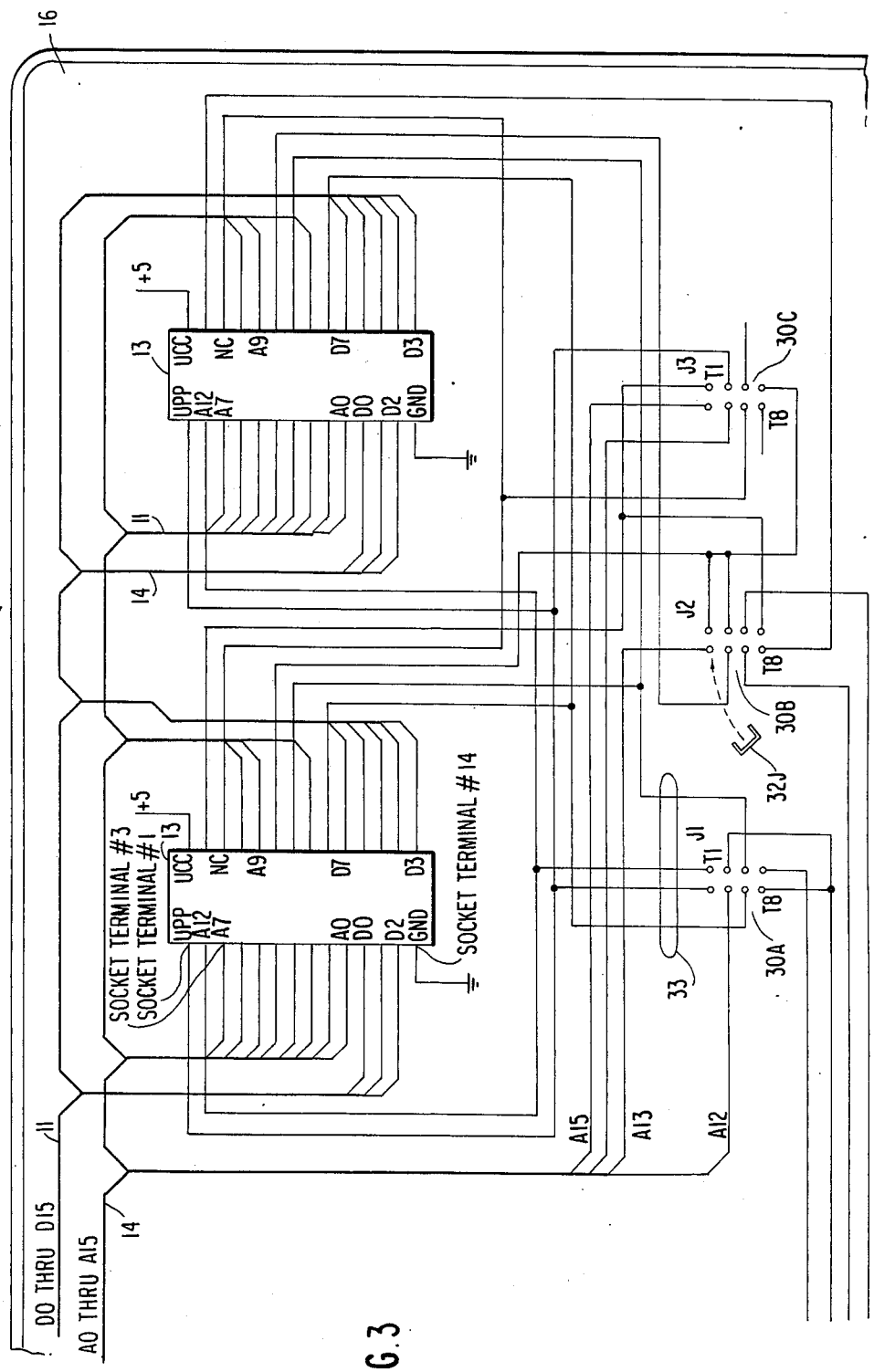
FIG. 3 is a circuit diagram of a pair of sockets for a pair of the memory chips shown in FIG. 1 incorporating the invention.

As shown in FIG. 3 the sockets are wired (printed) for a 28 pin IC chip, which may be an 8K byte IC memory chip. If a 24 pair IC chip iss placed in the socket pin 1 thereof would be where pin 3 is on the 28 pin chip. The twelve pairs of jumper clusters 30A, 30B and 30C permit the printed circuit connected to the terminals of the sockets to be rewired to accept the 24 pin IC chip and thereby gives the circuit design a great deal of versatility in being able to substitute and use IC chips which do not have physical pin compatibility. It avoids delays in production because of delays or unavailablilty of the component for which the circuit board was designed.

The fact that the memory chip has been changed from an 8K chip to a 4K chip will, of course, have to be entered to the chip map in the microprocessor 10 so the definition of the boundary of the memory relative to the socket pair is known to the system. Thus, it is not necessary that all components, such as memory components 13, be identical. However, since the jumpering affects the socket pairs, the IC chips in a socket pair must be the same.

Figure 4:
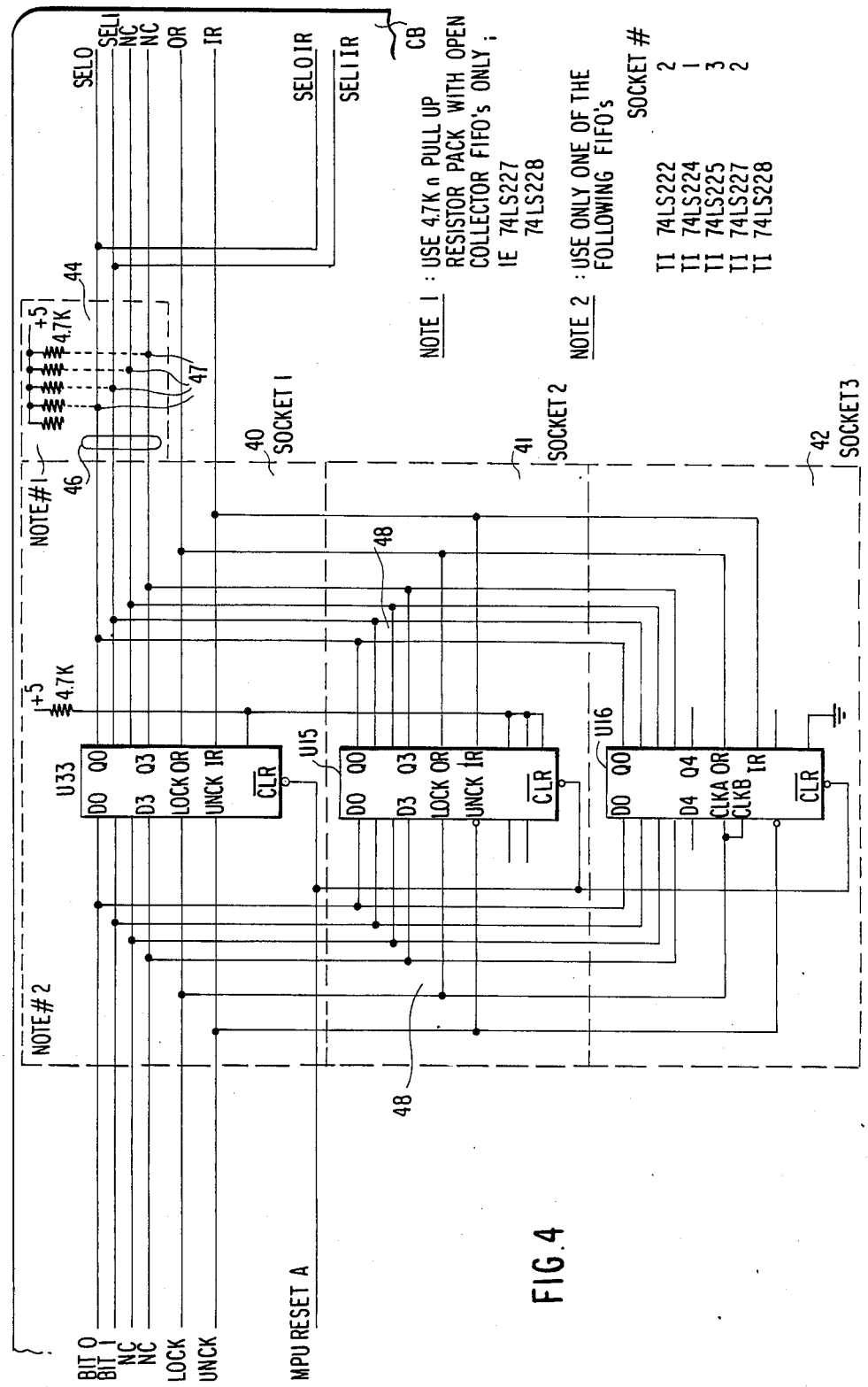
FIG. 4 is a circuit diagram illustrating another aspect of the invention wherein redundant sockets are provided.

Referring now to FIG. 4, which disclosess a FIFO circuit (a self-addressed memory chip that remembers the order of data that is stored in it, such that the first data written into it is automatically the first out), three separate component sockets 40, 41 and 42 are provided on the circuit board so that any one of a number of quite different circuit components can be used, depending on their availability (see "Note 2"). When certain open collector FIFO's are used, a pull up resistor pack 44 can be connected across the output lines 45 (SEL0, SEL1, NC, NC) because the printed circuit pathways 46 are provided with component eyelets 47 for that contingency. The redundant parallel printed circuit wiring 48 of each of the sockets goes to different pin numbers of the socket so any delay in a specific component availability does not delay manufacture of the completed circuit board since the circuit can be easily adapted to different available functionally equivalent components using the redundant socket and circuit.

While there has been shown and described a prefered embodiment of the invention, it will be appreciated that other embodiments and adaptations of the invention will be obvious to those skilled in the art and come within the spring and scope of the claims appended hereto.

What is claimed is:

1. In a printed circuit board having a plurality of first integrated circuit chip sockets mounted on sets of socket terminals on said printed circuit board, and printed circuit wiring electrically connected to said socket terminals, respectively, in a predetermined pattern, the improvement comprising,
    at least one redundant socket terminals therefor on said printed circuit board,
    printed circuit wiring means connecting said set of redundant socket terminals in parallel to one set of said sets of socket terminals so that in the event the integrated circuit chip for which said one of said first integrated circuit chip was designed is unavailable, a functionally equivalent integrated circuit chip can be received in said redundant integrated chip socket.

2. A method of avoiding production delay in the manufacture of electronic circuit boards due to unavailability of specified integrated circuit chip components for which the electronic circuit board was designed, comprising,
    constructing the circuit board with redundant printed circuit paths relative to integrated circuit chip sockets on said circuit board for receiving said specified integrated circuit chip components,
    providing connection points for discrete external components to be connected to said redundant printed circuit paths, in the event of unavailability of said specified components.

3. The invention defined in claim 2 wherein said redundant circuit paths include banks or plurality of closely spaced jumper terminal pairs and inserting jumper conductors between selected ones of pairs of said jumper terminals to electronically configure said circuit paths for an available chip component.

* * * * *